(12) United States Patent
Chen et al.

(10) Patent No.: US 11,029,603 B2
(45) Date of Patent: Jun. 8, 2021

(54) CHEMICAL REPLACEMENT SYSTEM

(71) Applicant: Taiwan Semiconductor Manufacturing Co., Ltd., Hsinchu (TW)

(72) Inventors: Yu Kai Chen, Kaohsiung (TW); Forster Yuan, Tainan (TW); Ko-Bin Kao, Taichung (TW); Shi-Ming Wang, Tainan (TW); Su-Yu Yeh, Tainan (TW); Li-Jen Wu, Tainan (TW); Oliver Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 197 days.

(21) Appl. No.: 16/226,139

(22) Filed: Dec. 19, 2018

(65) Prior Publication Data

US 2020/0103756 A1    Apr. 2, 2020

Related U.S. Application Data

(60) Provisional application No. 62/738,660, filed on Sep. 28, 2018.

(51) Int. Cl.
| | |
|---|---|
| *G03F 7/16* | (2006.01) |
| *H01L 21/67* | (2006.01) |
| *B25J 9/16* | (2006.01) |
| *B25J 5/00* | (2006.01) |
| *G06K 19/07* | (2006.01) |

(52) U.S. Cl.
CPC .............. *G03F 7/164* (2013.01); *B25J 5/007* (2013.01); *B25J 9/1669* (2013.01); *B25J 9/1679* (2013.01); *G06K 19/0723* (2013.01); *H01L 21/6715* (2013.01); *H01L 21/67253* (2013.01)

(58) Field of Classification Search
CPC combination set(s) only.
See application file for complete search history.

(56) References Cited

U.S. PATENT DOCUMENTS

| | | | |
|---|---|---|---|
| 2006/0255138 A1* | 11/2006 | Chang | H01L 21/67294 235/435 |
| 2010/0071620 A1* | 3/2010 | Oh | B05C 11/101 118/708 |
| 2015/0000591 A1* | 1/2015 | Kawasaki | H01L 21/67775 118/695 |
| 2017/0242340 A1* | 8/2017 | Jang | H01L 21/6719 |

* cited by examiner

*Primary Examiner* — Kyle O Logan
(74) *Attorney, Agent, or Firm* — Sterne, Kessler, Goldstein & Fox P.L.L.C.

(57) ABSTRACT

Embodiments of the present disclosure describe a chemical replacement system and a method to automatically replace PR bottles. The chemical replacement system includes a computer system and a transfer module. The computer system can receive a request signal to replace one or more chemical containers and transmit a command to the transfer module. The transfer module, being controlled by the computer system, can include a holder configured to hold the one or more chemical containers (e.g., PR bottles); a door unit configured to open in response to the command; and a transfer unit configured to eject the holder in response to the command for replacement. The chemical replacement system can further include an automated vehicle configured to replace the one or more chemical containers in the ejected holder.

20 Claims, 5 Drawing Sheets

CHEMICAL REPLACEMENT SYSTEM

This application claims the benefit of U.S. Provisional Patent Application No. 62/738,660, titled "Chemical Replacement System," which was filed on Sep. 28, 2018 and is incorporated herein by reference in its entirety.

BACKGROUND

Semiconductor integrated circuit (IC) fabrication involves a plurality of processes, including a photolithography process. Photoresist (PR) is a crucial element in the photolithography process. PR is used in various stages of semiconductor fabrication process for forming patterns on wafers. PR bottles (e.g., bottles that contain PR for semiconductor fabrication usage) have been manually replaced for PR refill/replacement. However, manual replacement of PR bottles can be time-consuming and costly, and can be susceptible to human mistakes and damages.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
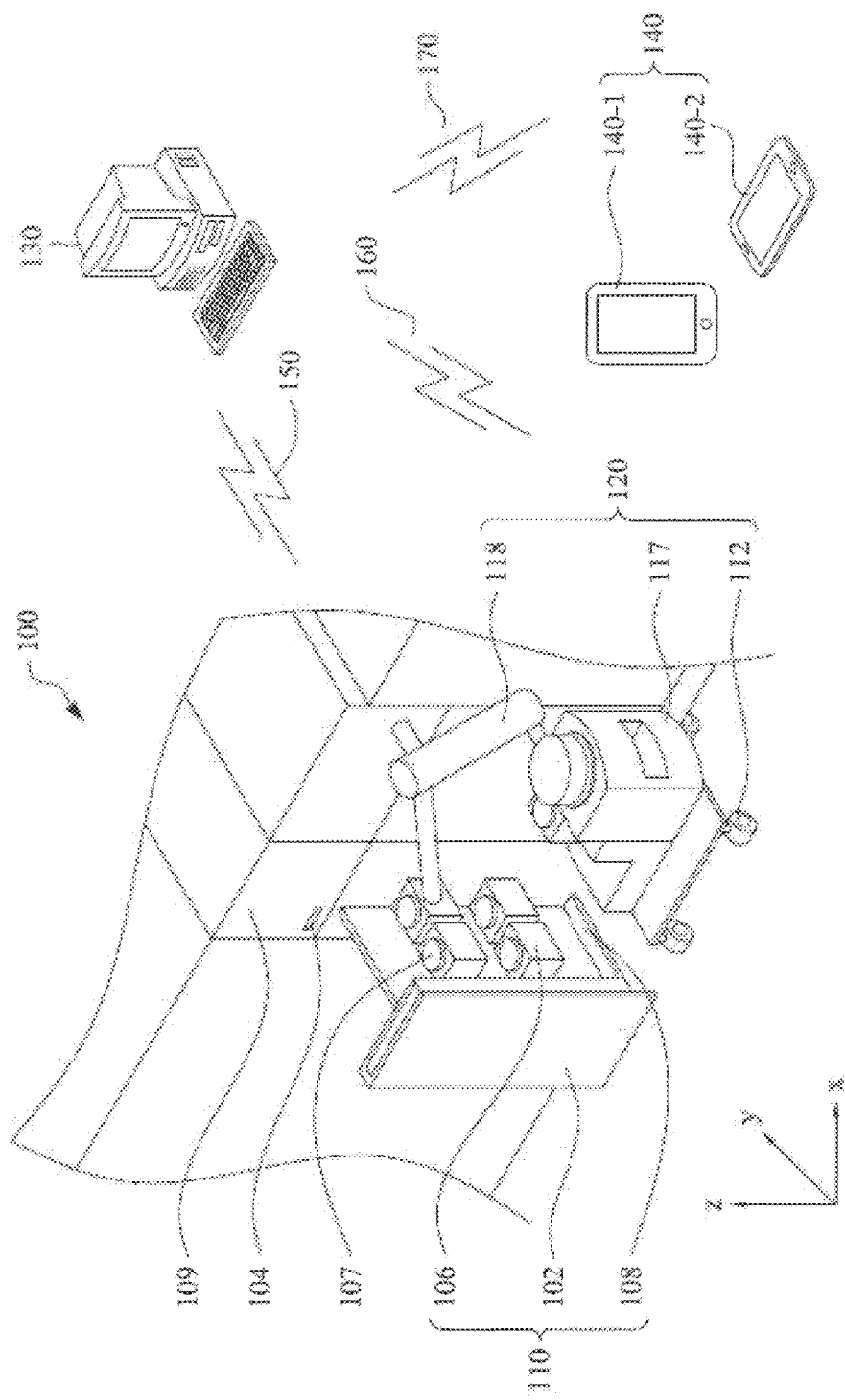
FIG. 1 illustrates an exemplary chemical replacement system, according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples. This repetition does not in itself dictate a relationship between the various embodiments and/or configurations discussed.

Further, spatially relative terms, such as "beneath," "below," "lower," "on," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

In semiconductor fabrication, PR is a crucial element for forming various patterns/features. PR can be kept in PR bottles, which can be stored in a PR cabinet and connected to a dispensing facility through hoses for various fabrication processes. When a PR bottle is low in PR or is empty, the PR bottles can be manually replaced. The replacement of PR bottles can include manually opening the PR cabinet and transporting the empty PR bottles to a specific location (e.g., warehouse) to replace or refill the PR bottles. The replacement and refill of the PR bottles can be susceptible to PR bottle damage, PR cabinet damage, hose damage, and human error; this process can also be time-consuming and costly.

Embodiments of the present disclosure describe a chemical replacement system and methods to automatically replace an empty chemical container (e.g., an empty PR bottle) with a filled chemical container (e.g., a filled PR bottle or a full PR bottle). The chemical replacement system can include a computer system and a transfer module. The computer system can receive a request signal to replace the chemical container and transmit a command to the transfer module. The transfer module, being controlled by the computer system, can include a holder configured to hold one or more chemical containers (e.g., PR bottles); a door unit configured to open in response to the command; and a transfer unit configured to eject the holder in response to the command for replacement. The chemical replacement system can further include an automated vehicle configured to replace the chemical container in the ejected holder. A benefit, among others, includes that the replacement of PR bottles can be automated so that the replacement of PR bottles is less susceptible to uncertainties/errors caused by human operations, e.g., misplacement of PR bottles and damage to the PR bottles, PR cabinet, and/or hoses. Further, the automated replacement process can save labor and reduce production cost.

FIG. 1 illustrates an exemplary chemical replacement system 100 that can automatically replace the PR bottles, according to some embodiments. Chemical replacement system 100 can include a transfer module 110, an automated vehicle 120, a computer system 130, electronic devices 140 (e.g., tablet 140-1 and cell phone 140-2), and communication networks 150, 160, and 170. Computer system 130 can receive a request signal to replace the PR bottle and transmit a command to transfer module 110. After receiving the command from computer system 130, transfer module 110 can open a door unit 102 of a PR cabinet 109 and eject a holder 106, using a transfer unit 108. In some embodiments, transfer unit 108 is a movable platform (e.g., a transferring belt or a sliding track) driven by a motor to control a movement of holder 106 (e.g., along y-axis). The motor can be powered by various forms, such as DC current, AC current, battery, etc. After the ejection of holder 106, automated vehicle 120 can replace an empty PR bottle in holder 106 with a full PR bottle on automated vehicle 120.

Automated vehicle 120 can carry PR bottles; move to a first location (e.g., a location where an empty PR bottle is located); transfer, with a robotic arm 118, a first PR bottle (e.g., an empty PR bottle or a chemical container to be replaced) from holder 106 to automated vehicle 120; and transfer, with robotic arm 118, the second PR bottle (e.g., a full PR bottle or a chemical container to be replaced with) from automated vehicle 120 to holder 106. In some embodiments, automated vehicle 120 can load the empty PR bottle from a first location (e.g., a location where an empty PR bottle is located) onto automated vehicle 120, transport the loaded empty PR bottle to a second location (e.g., a location where a full PR bottle is located), replace the empty PR bottle with the full PR bottle, transport the loaded full PR bottle back to the first location, and unload the full PR bottle. For ease of description, an "empty PR bottle" can represent a PR bottle that is to be replaced, and a "full PR bottle" can represent a filled PR bottle for replacing the empty PR bottle. In some embodiments, automated vehicle 120 includes a vehicle body 117 for holding the PR bottles, a plurality of wheels 112, and robotic arm 118 for loading/unloading the PR bottles.

Automated vehicle 120 can also include a control unit (not shown in FIG. 1) that controls various operations of automated vehicle 120. For example, the control unit can control a communication between automated vehicle 120 and computer system 130, the automated loading and unloading of PR bottles, and the movement of robotic arm 118. The control unit can include suitable software and hardware, such as computer programs stored in a memory and a processor and related circuitry to execute various operations. In some embodiments, automated vehicle 120 stores a map of the fabrication facility and is installed with suitable positioning systems, so that automated vehicle 120 can move in the fabrication facility following designated routes. For example, the control unit of automated vehicle 120 can include a global positioning system (GPS) receiver, an electronic device/program with a Bluetooth-based indoor positioning system, and/or an electronic device/program with a WiFi-based indoor positioning system for navigating in the fabrication facility according to the indoor map. The fabrication facility can include corresponding devices for the indoor positioning system, such as Bluetooth beacons and/or WiFi access points distributed at various locations for the indoor positioning functions. The control unit can be arranged at any suitable position of automated vehicle 120. In some embodiments, the control unit is positioned in vehicle body 117.

In some embodiments, automated vehicle 120 can further include an ID tag (e.g., radio frequency identification (RFID) tag, not shown in FIG. 1). And chemical replacement system 100 can include an II) sensing device 104 (e.g., RFID reader) to receive the request signal to replace the PR (e.g., by detecting the RFID tag in response to an approaching automated vehicle 120 that carries a full PR bottle to be replaced with). After II) sensing device 104 receives the request signal from nearby automated vehicle 120, computer system 130 can transmit a command to transfer module 110 to open door unit 102 and eject holder 106. In some embodiments, chemical replacement system 100 can further include an anti-collision sensor (not shown in FIG. 1). The anti-collision sensor can be mounted on door unit 102 or on sidewalls of PR cabinet 109. The anti-collision sensor can scan and detect surrounding objects, and communicate with computer system 130 to prevent the ejection of holder 106 and avoid collision during the replacement process, such as during or prior to the opening of door unit 102. For example, the anti-collision sensor can transmit a notification signal indicating an unsafe condition for the opening of door unit 102 and/or the ejection of holder 106 to computer system 130, which delays the replacement request until the area is clear of surrounding objects.

Chemical replacement system 100 can further include a pairing recognition means. The pairing recognition means can include any suitable wireless recognition method that can exclusively and automatically pair holder 106 with PR bottles. For example, the pairing recognition means can include an RFID tag and reader and/or a Bluetooth transmitter and reader. In some embodiments, holder 106 and PR bottles can include an RFID tag and reader configured to couple the PR bottle and the respective holder. The RFID tag can include the chemical information of the PR bottle and be used to match the PR bottle with its respective holder to ensure that the correct PR bottle/holder pairing during replacement process. In some embodiments, when another PR bottle (e.g., a PR bottle that has an RFID tag mismatch to a corresponding RFID reader) is mistakenly placed in holder 106, an error message can be transmitted to computer system 130 and a notification regarding the mistaken PR bottle replacement can be transmitted to electronic devices 140 (e.g., tablet 140-1 and cell phone 140-2) (e.g., associated with one or more technicians responsible for PR bottle replacement). The error message and/or the notification can also include the ID of the holder and the PR bottle, the time, and the location of the replacement. In some embodiments, holder 106 includes an indicator light (not shown in FIG. 1) attached at a suitable position (e.g., the sidewall of holder 106 or door unit 102). The indicator light can communicate with holder 106 through wired and/or wireless means. In some embodiments, when a mistaken PR bottle is placed in holder 106, the indicator light emits a warning signal (e.g., red flashing light); and when a correct PR bottle is placed in holder 106, the indicator light emits a different signal (e.g., green light). Thus, holder 106 can automatically identify the pairing PR bottle and transmit notifications when an incorrect PR bottle is placed in holder 106. In some embodiments, after identification of an incorrect PR bottle replacement, holder 106 can transmit a notification to request for another PR bottle replacement to correct the misplacement.

Holder 106 can further include a leakage detection mechanism that includes a liquid detection sensor (not shown in FIG. 1) positioned at a bottom surface of holder 106. When a leakage of PR bottle 107 occurs, the leaked PR can be detected by the liquid detection sensor. The liquid detection sensor can communicate with computer system 130. When receiving the leakage notification from the liquid detection sensor, computer system 130 can send notifications (e.g., to technicians responsible for monitoring PR bottle replacement) via electronic devices 140 (e.g., tablet 140-1 and cell phone 140-2). The notifications can include the ID of the holder/PR bottle, the time, and the location of the leakage.

Computer system 130 can include any suitable computer system that controls the operations of transfer module 110 and automated vehicle 120 and communicates with electronic devices 140. Electronic devices 140 (e.g., tablet 140-1 and cell phone 140-2) can include any suitable portable device and can be used to communicate with computer system 130. In some embodiments, each electronic device 140 (e.g., tablet 140-1 and cell phone 140-2) includes a processor and related circuitry for processing and responding to the notifications/commands transmitted by computer system 130. In some embodiments, computer system 130 can receive a request signal to replace the chemical container, to transmit a command to transfer module 110, an, to transmit notifications of real-time PR bottle replacement status to tablet 140-1 and/or cell phone 140-2. In some embodiments, computer system 130 receives the request signal to replace the chemical container (e.g., an empty PR bottle) from automated vehicle 120. In some embodiments, computer system 130 receives the request signal to replace the chemical container from holder 106, indicating that the chemical container in holder 106 is low or empty in the chemical (e.g., PR). In some embodiments, computer system 130 receives the request signal to replace the chemical container from electronic device 140. Chemical replacement system 100 can further include a detection means (e.g. imaging device or pressure sensor) to monitor the status of chemical container and send a notification indicating that the chemical container is low or empty. Computer system 130 can (i) receive a notification sent by the detection means indicating that the chemical container is low or empty; (ii) communicate with automated vehicle 120 to initiate a replacement process; (iii) receive the request signal to replace the chemical container from automated vehicle 120; and (iv) transmit the command to transfer module 110 to control operations associated with the replacement (e.g., opening of door unit 102 of PR cabinet 109 and ejection of holder 106). In some embodiments, the detection means includes a bubble empty sensor, installed on a hose connecting to the chemical container, to monitor the status of chemical container and to send a notification indicating that the chemical container is low or empty. In some embodiments, the request signal includes detailed information associated with the PR bottle, such as the location of the PR bottle, the time of the request, the ID number of the PR bottle, etc. In some embodiments, computer system 130 can receive real-time data from transfer module 110 and holder 106 and transmit notifications (including the real-time status of replacement process) to tablet 140-1 and/or cell phone 140-2. In some embodiments, computer system 130 can receive real-time data from automated vehicle 120 and transmit notifications including the real-time status of automated vehicle 120 to tablet 140-1 and/or cell phone 140-2. Transfer module 110 can communicate with computer system 130 through communication network 150. Automated vehicle 120 can communicate with computer system 130 through communication network 160. Electronic devices 140 (e.g., tablet 140-1 and cell phone 140-2) can communicate with computer system 130 through communication network 170. Communication networks 150, 160, and 170 can each be a suitable wired or wireless communication means. In some embodiments, communication networks 150, 160, and 170 include WiFi.

In some embodiments, one or more parameters are predetermined and stored in computer system 130 to enable the replacement process to be more precise/controllable. For example, the identification and location of the PR bottles and holders, the orientations of the PR bottles, and the dimensions of the PR bottles can be predetermined and stored in computer system 130. Thus, computer system 130 can more precisely control and monitor the placement and movement of PR bottles during the replacement process. In some embodiments, after PR bottle replacement is completed, computer system 130 can transmit a notification including a status update (e.g., including the completion of PR bottle replacement, the time, and the ID numbers of the PR bottle and holders) to one or more electronic devices 140 (e.g., tablet 140-1 and cell phone 140-2). Computer system 130 can be located at any suitable location. For example, computer system 130 can be inside or outside the fabrication facility or can be installed on PR cabinet 109.

Figure 2A:
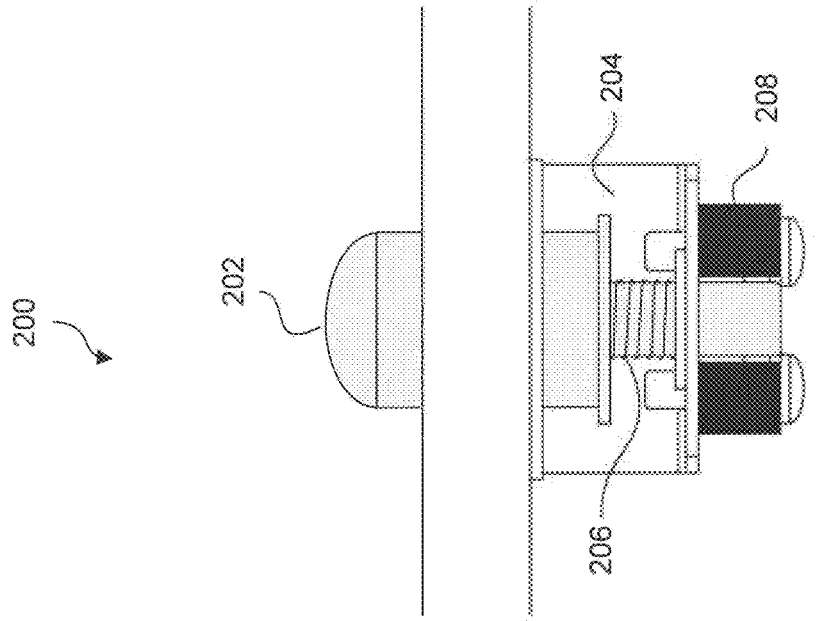
FIGS. 2A and 2B illustrate an exemplary placement sensor structure, according to some embodiments.
Figure 2B:
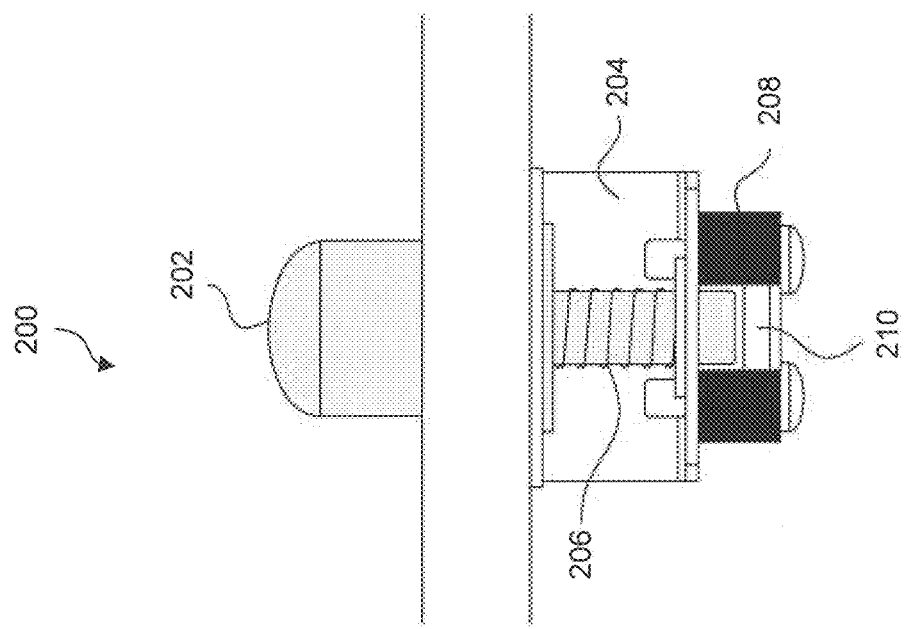

FIGS. 2A and 2B illustrate an exemplary placement sensor structure, according to some embodiments. Holder 106 (as shown in FIG. 1) can have 3-pin structure at its bottom surface to hold PR bottle 107. The 3-pin structure can include 3 pins located at the bottom of holder 106, arranged in triangle (e.g., equilateral triangle). Each pin can include a placement sensor structure 200 to ensure correct placement of PR bottle 107 in holder 106. In some embodiments, the holder (e.g., holder 106) can have multiple pin structures. The number of pins can be, but is not limited to, 3, 4, 5, 6, 7, 8, 9, 10, to ensure placement accuracy. Placement sensor structure 200 can include a sensor pin 202, a sensor bracket 204, a spring 206, and a photo interrupter 208. Photo interrupter 208 can operate in a through beam arrangement or a retroreflective arrangement.

In the through beam arrangement, photo interrupter 208 can include a transmitter and a receiver located within the line-of-sight of the transmitter. With this arrangement, an object is detected when a light beam 210 (emitted by the transmitter) is blocked between the transmitter and receiver.

In the retroreflective arrangement, photo interrupter 208 can include the transmitter and the receiver at the same location and a reflector configured to reflect light beam 210 (emitted by the transmitter) back to the receiver. With this arrangement, an object is sensed when light beam 210 is interrupted and fails to reach the receiver.

During the PR bottle replacement process, PR bottle 107 is removed from automated vehicle 120 and loaded onto holder 106 by robotic arm 118. As shown in FIG. 2B, the correctly loaded PR bottle can press sensor pin 202 to move in a downward direction (e.g., in the z-direction) and compress spring 206 located in sensor bracket 204. The downward moved sensor pin 202 can block light beam 210 (e.g., LED ray) located near the bottom of placement sensor structure 200. Thus, photo interrupter 208 can send a confirmation signal to indicate correct placement of PR bottle 107 in holder 106. As shown in FIG. 2A, if PR bottle 107 is not placed or not correctly placed in holder 106, spring 206 can be partially or not compressed, causing light beam 210 to pass through and to be detected by the receiver. Thus, photo interrupter 208 can send a signal to indicate incorrect placement of PR bottle 107 in holder 106. Photo interrupter 208 can communicate the signal to computer system 130. When receiving the misplacement notification from photo interrupter 208, computer system 130 can send notifications (e.g., to technicians responsible for monitoring PR bottle replacement) to electronic devices 140 (e.g., tablet 140-1 and cell phone 140-2) to report the misplacement or correct placement of the PR bottles.

Figure 3:
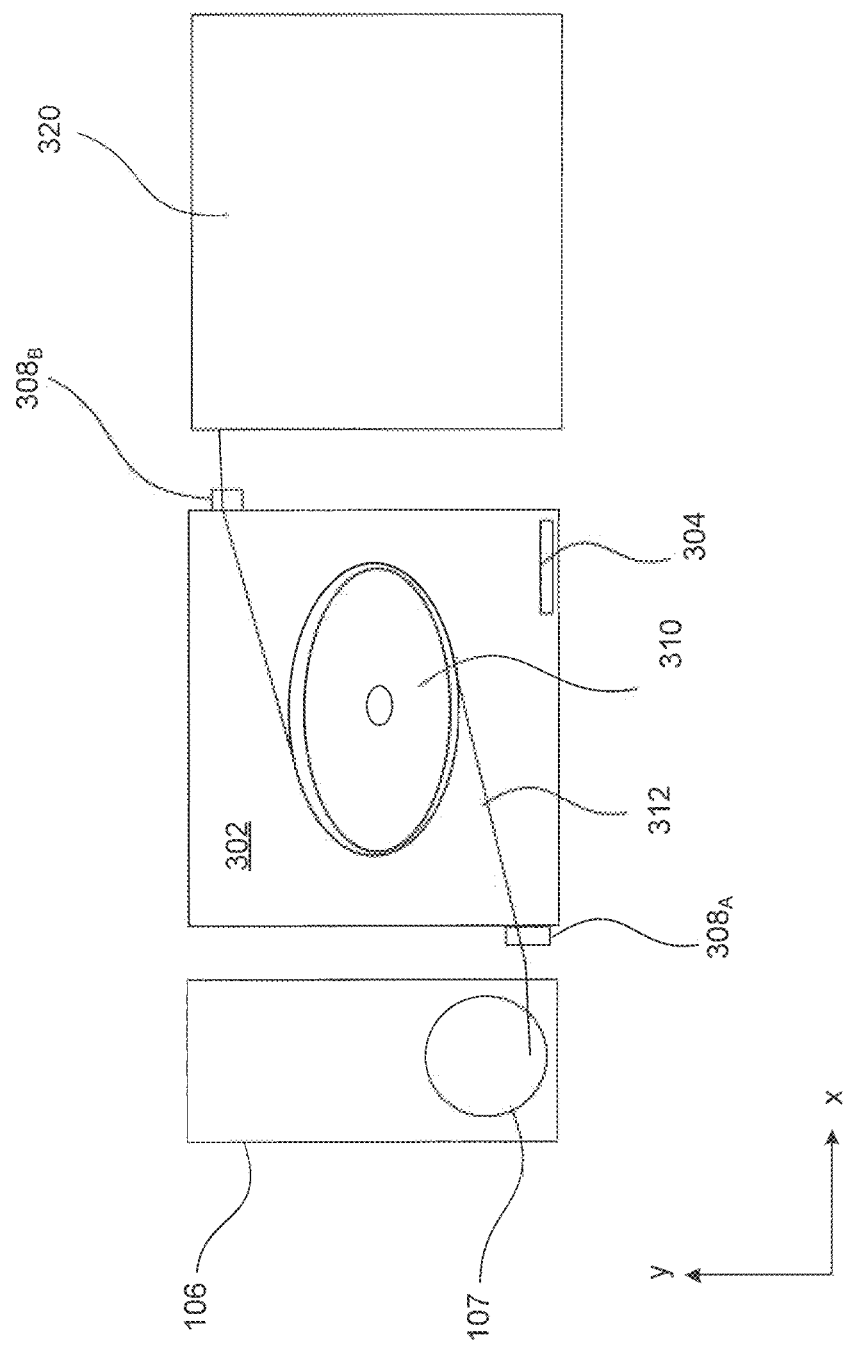
FIG. 3 illustrates a top view of an exemplary holder, an exemplary winding device, and an exemplary dispensing system, according to some embodiments.

FIG. 3 illustrates a top view of an exemplary holder, an exemplary winding device, and an exemplary dispensing system, according to some embodiments. Holder 106 can include a hose 312 configured to deliver PR in the PR bottle 107 to a chemical dispensing system 320. The PR bottle replacement system can further include an automatic winding device 302 configured to wind hose 312. The hose can be a flexible tube connected to holder 106 for delivery of PR from PR bottle 107 to, e.g., a fabrication platform through chemical dispensing system 320. In some embodiments, an end of hose 312 can be connected to a weight (e.g., an object that is sufficiently heavy to immerse into the PR of PR bottle 107) that has a detectable shape/size (e.g., a shape/size that can be detected using a recognition function) so that when the weight sinks into PR bottle 107, hose 312 can sufficiently draw PR. HI-ose 312 can include, but is not limited to, nylon, polyurethane, polyethylene (e.g., low-density polyethylene), polyvinyl chloride, synthetic or natural rubbers, polytetrafluoroethylene (e.g., Teflon), and/or stainless steel. Hose 312 can include an anti-friction coating to reduce friction during winding/unwinding. The anti-friction coating can include, but is not limited to, polytetrafluoroethylene, graphite, hexagonal boron nitride, molybdenum disulfide, tungsten disulfide, zinc stearate, calcium stearate, potassium stearate, fatty soap, emulsified wax, and/or clay-based slurries. In some embodiments, hose 312 has a length between about 100 cm and about 150 cm. In some embodiments, hose 312 has a length about 120 cm. In some embodiments, a length of hose 312 is equal to or greater than a distance between chemical dispensing system 320 and a location of holder 106 when holder 106 is fully ejected.

Winding device 302 can be used to wind/unwind hose 312. In some embodiments, winding device 302 includes a center roll 310 on which hose 312 is wound. Center roll 310 can include, but is not limited to, a bobbin, a spool, a reel, and a belt-winding shell. In some embodiments, center roll 310 can further include metal bars that travel through the center of the roll, configured to provide torque control to wrap hose 312 onto center roll 310. Winding device 302 can be powered by various forms, such as DC current, AC current, battery, and/or mechanical means (e.g., spring system). In some embodiments, winding device 302 includes a hose inlet $308_A$ and a hose outlet $308_B$. In some embodiments, an end of hose 312 connects with PR bottle 107 to draw PR from PR bottle 107, and another end of hose 312 passes through hose inlet $308_A$ into winding device 302 with a portion of hose 312 wound onto center roll 310. The other end of hose 312 then passes through hose outlet $308_B$ exiting winding device 302 and connects with chemical dispensing system 320 for fabrication operations (e.g., photolithography process). Winding device 302 can further include a leakage detection mechanism with a liquid detection sensor 304 positioned at a bottom surface of winding device 302. When hose 312 leaks (e.g., broken hose), the leaked PR can be detected by liquid detection sensor 304. Liquid detection sensor 304 can communicate the leakage notification to computer system 130. In turn, computer system 130 can send notifications (e.g., to technicians responsible for monitoring PR bottle replacement) to electronic devices 140 (e.g., tablet 140-1 and cell phone 140-2) to inform the leakage of hose 312. The notifications can include the ID of the holder/PR bottle, the time, and/or the location of the leakage.

Figure 4:
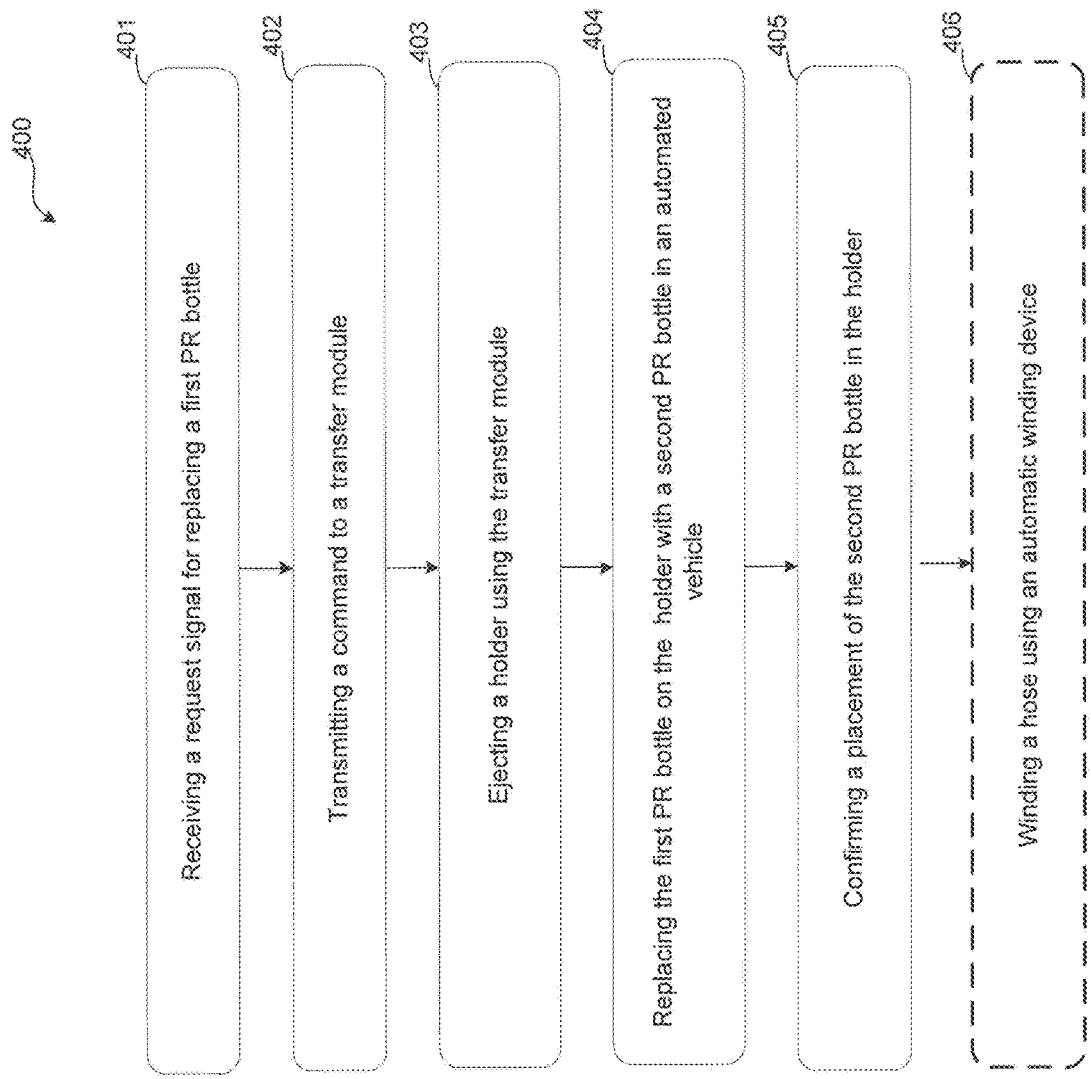
FIG. 4 illustrates an exemplary PR bottle replacement method, according to some embodiments.

FIG. 4 illustrates an exemplary PR bottle replacement method 400 using the system disclosed by the present disclosure, according to some embodiments. Operations shown in method 400 are not exhaustive; other operations can be performed as well before, after, or between any of the illustrated operations. In some embodiments, operations of method 400 can be performed in a different order. Variations of method 400 are within the scope of the present disclosure.

In operation 401, a request signal for replacing a first PR bottle (e.g., an empty PR bottle) is received by a computer system (e.g., computer system 130). In some embodiments, the computer system receives the request signal to replace the first PR bottle from an automated vehicle (e.g., automated vehicle 120). In some embodiments, the computer system receives the request signal from a detection means (e.g., a bubble empty sensor installed on a hose connecting to the PR bottle) indicating that the first PR bottle (e.g., PR bottle 107) is low or empty in PR. In some embodiments, the computer system receives the request signal from an electronic device (e.g., electronic device 140) when a technician determines that the first PR bottle should be replaced. The request signal can include detailed information of the first PR bottle, such as the location of the first PR bottle, the time of the request, the ID number of the first PR bottle, etc. In some embodiments, the ID number of the PR bottle is uniquely stored in the computer system. The ID number can include any suitable label/code such as a string of numbers/characters, an RFID, a bar code, etc. The ID number can be associated with the type of PR contained in the PR bottle, the dimensions of the PR bottle, etc. The ID number can be imprinted on the PR bottle and/or a holder (e.g., holder 106). In some embodiments, the ID number can be scanned/read out by a corresponding scanner/reader, such as an RFD reader, bar code reader, etc. Additional details of the chemical replacement system, with respect to operation 401, can be found above with respect to the description of FIG. 1.

In operation 402, a command is transmitted from the computer system to a transfer module (e.g., transfer module 110). After receiving the request signal for replacing the first PR bottle, the computer system can process, generate, and transmit the command to the transfer module and control the operation of different parts of the transfer module based on the command. The computer system can communicate with the transfer module through a communication network. The communication network can be a suitable wired or wireless communication means. In some embodiments, the communication network includes WiFi. Additional, details of the chemical replacement system, with respect to operation 402, can be found above with respect to the description of FIG. 1.

In operation 403, the holder (e.g., holder 106) is ejected using the transfer module. After receiving the command from the computer system, the transfer module can open a door unit (e.g., door unit 102) of a PR cabinet (e.g., PR cabinet 109) and eject the holder, using a transfer unit (e.g., transfer unit 108). In some embodiments, the transfer unit is a movable platform (e.g., a transferring belt or a sliding track) coupled and driven by a motor to control a movement of the holder. The motor can be powered by various forms, such as DC current, AC current, battery, etc. In some embodiments, the chemical replacement system includes an anti-collision sensor, mounted on the door unit or on sidewalls of the PR cabinet. Prior to or during opening the door unit and ejecting the holder, the anti-collision sensor can scan and detect surrounding objects and communicate with the computer system to prevent unsafe ejection of the holder and avoid collision during the replacement process. For example, anti-collision sensor can send a notification to the computer system, indicating an unsafe condition for opening the door unit and ejecting the holder (e.g., human or other subjects in front of and/or within proximity of the door and the holder). In response, the computer system overrides the command to eject the holder, and temporarily delays the replacement process and resumes the replacement process once the area surrounding the door unit is clear of objects. Additional details of the chemical replacement system, with respect to operation 403, can be found above with respect to FIG. 1.

In operation 404, the first PR bottle (e.g., an empty PR bottle) in the holder is replaced with a second PR bottle (e.g., a full PR bottle) in an automated vehicle (e.g., automated vehicle 120). The automated vehicle can carry the second PR bottle; move to a first location (e.g., a location where an empty PR bottle is located); transfer, with a robotic arm (e.g., robotic arm 118), the first PR bottle (e.g., an empty PR bottle or a chemical container to be replaced) from the holder to the automated vehicle; and transfer, with the robotic arm, the second PR bottle (e.g., a full PR bottle or a chemical container to be replaced with) from the automated vehicle to the holder. In other embodiments, the automated vehicle loads the empty PR bottle from the first location (e.g., a location where an empty PR bottle is located) onto the automated vehicle, transports the loaded empty PR bottle to a second location (e.g., a location where a full PR bottle is located), replaces the empty PR bottle with the full PR bottle, transports the loaded full PR bottle back to the first location, and unloads the full PR bottle into the holder. The automated vehicle can be powered by various forms, such as DC current, AC current, battery, etc. Additional details of the automated vehicle, with respect to operation 404, can be found above with respect to the description of FIG. 1.

In operation 405, a placement of the second PR bottle on the holder is confirmed by using a plurality of placement sensor structures (e.g., three placement sensor structure 200). Each placement sensor structure can include a sensor pin (e.g., sensor pin 202), a sensor bracket (e.g., sensor bracket 204), a spring (e.g., spring 206), and a photo interrupter (e.g., photo interrupter 208). After the replacement of the PR bottle using the automated vehicle, the corrected loaded second PR bottle can press the sensor pin to move in a downward direction and compress the spring located in the sensor bracket. The downward moved sensor pin can block a light beam (e.g., LED ray) located near the bottom of the placement sensor structure. The photo interrupter can send a confirmation signal to indicate correct placement of the second PR bottle in the holder. If the second PR bottle is not correctly placed in the holder, the photo interrupter can send a signal to the computer system to indicate an incorrect placement of the second PR bottle in the holder. After receiving the misplacement notification from the photo interrupter, the computer system can send notifications (e.g., to technicians responsible for monitoring PR bottle replacement) via the electronic devices to report a misplacement of the second PR bottle. Additional details of the placement sensor structure, with respect to operation 405, can be found above with respect to FIGS. 2A and 2B.

In some embodiments, method 400 further includes optional operation 406, which winds a hose (e.g., hose 312) using an automatic winding device (e.g., winding device 302). The winding device can include a center roll (e.g., center roll 310) on which the hose is wound up. In some embodiments, the center roll can further include metal bars that travel through the center of the roll, which can provide torque control to wrap the hose onto the center roll. The winding device can be powered by various forms, such as DC current, AC current, battery, and/or mechanical means (e.g., spring system). Additional details of the winding device, with respect to optional operation 406, can be found above with respect to the description of FIG. 3.

By using the disclosed chemical replacement system and methods, the replacement of PR bottles can be automated, and less labor is needed. The automated operation can reduce the number of PR bottles, PR cabinet components, and hoses that are damaged during the replacement process. The accuracy of the replacement process can also be improved, e.g., by the use of a placement sensor to confirm the correct placement of PR bottle in the holder and by the use of pairing recognition means (e.g., RFID tag and reader) to automatically identify the pairing PR bottle and the PR bottle holder. Further, because the time to replace empty PR bottles is reduced, the replacement process can be less costly.

Figure 5:
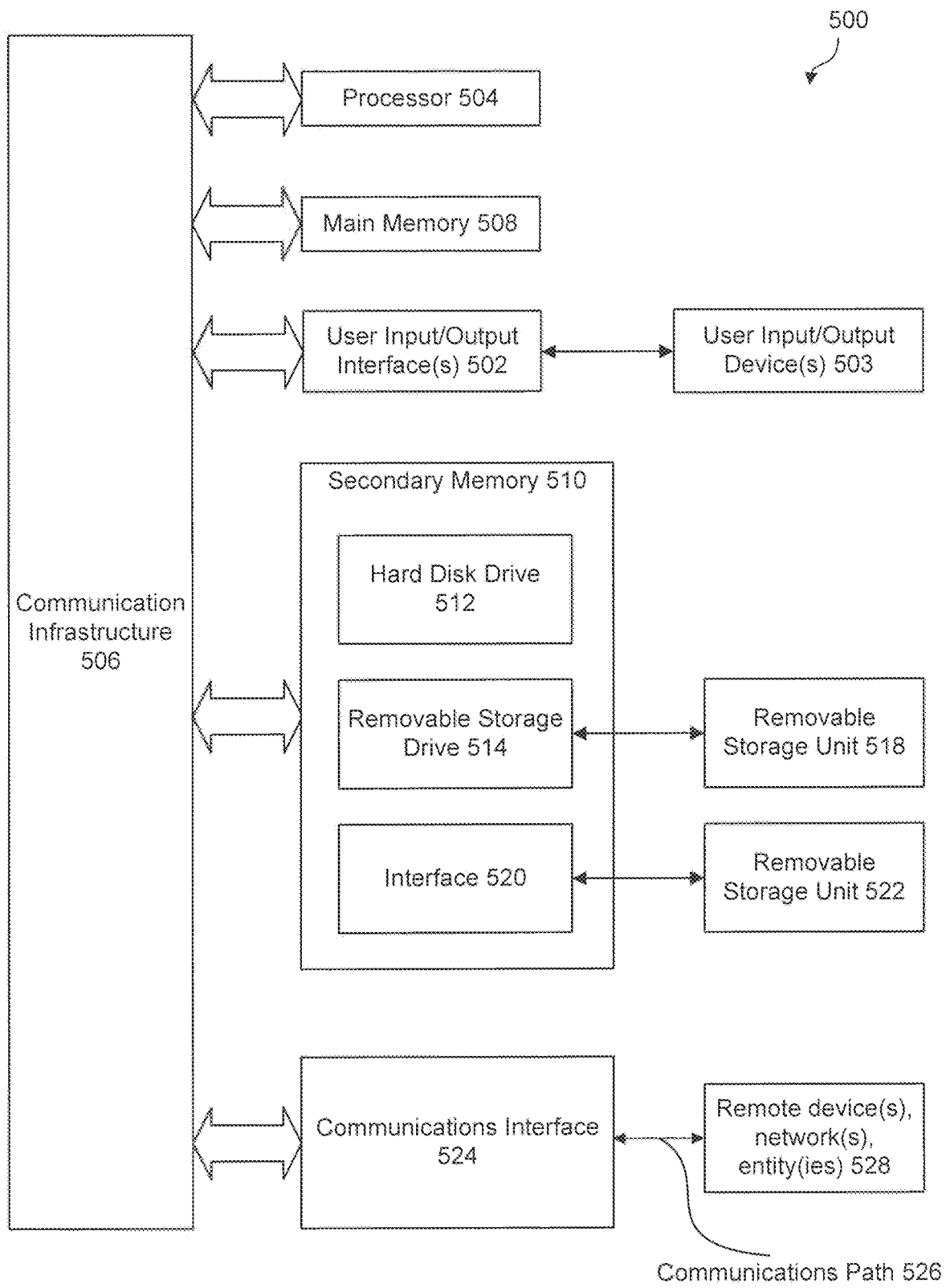
FIG. 5 illustrates an exemplary computer system for implementing various embodiments.

FIG. 5 is an illustration of an example computer system 500 in which various embodiments of the present disclosure can be implemented, according to some embodiments. Computer system 500 can be used in the above described computer system (e.g., computer system 130), control unit of an automated vehicle (automated vehicle 120), and electronic devices (e.g., electronic devices 140). Computer system 500 can be a computer capable of performing the functions and operations described herein. For example, and without limitation, computer system 500 can be capable of receiving, processing and transmitting signals and commands. Computer system 500 can be used, for example, to execute one or more functions of a transfer module (e.g., transfer module 110), which describes example operations of communications amongst different parts of the transfer module and between the transfer module and the computer system.

Computer system 500 includes one or more processors (also called central processing units, or CPUs), such as a processor 504. Processor 504 is connected to a communication infrastructure or bus 506. Computer system 500 also includes input/output device(s) 503, such as touch screens, monitors, keyboards, pointing devices, etc., that communicate with communication infrastructure or bus 506 through input/output interface(s) 502. Computer system 500 can receive instructions to implement functions and operations described herein—e.g., functions of a holder (e.g., holder 106), the transfer module, and the automated vehicle, and method 400—via input/output device(s) 503. Computer system 500 can also include a main or primary memory 508, such as random access memory (RAM). Main memory 508 can include one or more levels of cache. Main memory 508 has stored therein control logic (e.g., computer software) and/or data. In some embodiments, the control logic (e.g., computer software) and/or data can include one or more of the functions described above with respect to the holder, the transfer module, and the automated vehicle.

Computer system 500 can also include one or more secondary storage devices or secondary memory 510. Secondary memory 510 can include, but is not limited to, a hard disk drive 512 and/or a removable storage device or drive 514. Removable storage drive 514 can be a floppy disk drive, a magnetic tape drive, a compact disk drive, an optical storage device, tape backup device, and/or any other storage device/drive.

Removable storage drive 514 can interact with a removable storage unit 518. Removable storage unit 518 includes a computer usable or readable storage device having stored thereon computer software (control logic) and/or data. Removable storage unit 518 can be a floppy disk, magnetic tape, compact disk, DVD, optical storage disk, and/any other computer data storage device. Removable storage drive 514 reads from and/or writes to removable storage unit 518 in a well-known manner.

According to some embodiments, secondary memory 510 can include other means, instrumentalities or other approaches for allowing computer programs and/or other instructions and/or data to be accessed by computer system 500. Such means, instrumentalities or other approaches can include, but is not limited, a removable storage unit 522 and an interface 520. Examples of the removable storage unit 522 and the interface 520 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 510, removable storage unit 518, and/or removable storage unit 522 can include one or more of the functions described above with respect to the holder.

Computer system 500 can further include a communication or network interface 524. Communication interface 524 enables computer system 500 to communicate and interact with any combination of remote devices, remote networks, remote entities, etc. (individually and collectively referenced by reference number 528). For example, communication interface 524 can allow computer system 500 to communicate with element 528 (e.g., remote devices) over communications path 526, which can be wired and/or wireless, and which can include any combination of LANs, WANs, the Internet, etc. Control logic and/or data can be transmitted to and from computer system 500 via communication path 526.

The functions/operations in the preceding embodiments can be implemented in a wide variety of configurations and architectures. Therefore, some or all of the operations in the preceding embodiments—e.g., functions of the holder, the door, the transfer unit, the computer system, the automated vehicle, and method 400—can be performed in hardware, in software or both. In some embodiments, a tangible system or article of manufacture including a tangible computer useable or readable medium having control logic (software) stored thereon is also referred to herein as a computer program product or program storage device. This includes, but is not limited to, computer system 500, main memory 508, secondary memory 510 and removable storage units 518 and 522, as well as tangible articles of manufacture embodying any combination of the foregoing. Such control logic, when executed by one or more data processing devices (such as computer system 500), causes such data processing devices to operate as described herein. In some embodiments, computer system 500 includes hardware/equipment for the manufacturing of photomasks and circuit fabrication. For example, the hardware/equipment can be connected to or be part of element 528 (remote device(s), network(s), entity(ies) 528) of computer system 500.

Embodiments of the present disclosure describe a chemical replacement system and a method to automatically replace PR bottles. The chemical replacement system includes a computer system and a transfer module. The computer system can receive a request signal to replace one or more chemical container and transmit a command to the transfer module. The transfer module, being controlled by the computer system, can include a holder configured to hold the one or more chemical containers (e.g., PR bottles); a door unit configured to open in response to the command, and a transfer unit configured to eject the holder in response to the command, for replacement. The chemical replacement system can further include an automated vehicle, configured to replace the chemical container in the ejected holder. A benefit, among others, includes that the replacement of PR bottles can be automated so that the replacement of PR bottles is less susceptible to uncertainties/errors caused by human operations, e.g., misplacement of PR bottles and damage to the PR bottles, PR cabinet, and/or hoses. Further, the automated replacement process can save labor and reduce production cost.

In some embodiments, a chemical replacement system provided by the present disclosure includes a computer system and a transfer module. The computer system can receive a request signal to replace the chemical container and transmit a command based on the request signal to the transfer module. The transfer module can include a holder configured to hold the one or more chemical containers; a door unit configured to open in response to the command, and a transfer unit configured to eject the holder in response to the command. The chemical replacement system can further include an automated vehicle, configured to replace the chemical container in the ejected holder. The chemical replacement system can further include an anti-collision sensor to avoid collision with surrounding objects during the ejection of the holder.

In some embodiments, a photoresist (PR) replacement system provided by the present disclosure includes an automated vehicle, a computer system, and a transfer module. The automated vehicle can be configured to hold and transport one or more PR bottles. In some embodiments, the automated vehicle includes a vehicle body configured to hold the one or more PR bottles, a plurality of wheels configured to transport the one or more PR bottles, and a robotic arm configured to load and unload the one or more PR bottles. The computer system can be configured to receive a request signal from the automated vehicle to replace at least one of the one or more PR bottles and transmit a command to the transfer module, based on the request signal. The transfer module can include a holder and a transfer unit. The transfer module can be configured to hold the one or more PR bottles in the holder and eject the holder using the transfer unit.

In some embodiments, a method for replacing a PR bottle provided by the present disclosure includes receiving a request signal for replacing the PR bottle in a holder; transmitting, via a communication network, a command to a transfer module; ejecting, with the transfer module, the holder; and replacing the PR bottle in the holder with another PR bottle transported by an automated vehicle. The method can further include scanning and detecting surrounding subjects to avoid collision using an anti-collision sensor prior to ejecting the holder, and replacing the first PR bottle on the holder with a second PR bottle in an automated vehicle.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A chemical replacement system, comprising:
   a computer system configured to:
      receive a request signal to replace one or more chemical containers; and
      transmit a command based on the request signal; and
   a transfer module comprising:
      a holder configured to hold the one or more chemical containers;
      a door unit configured to open in response to the command;
      a transfer unit configured to eject the holder in response to the command; and an anti-collision sensor configured to scan and detect one or more objects surrounding the door unit.

2. The chemical replacement system of claim 1, wherein the holder comprises a radio frequency identification (RFID) reader, each of the one or more chemical containers comprises an RFID tag, and wherein the RFID reader and the RFID tag are configured to pair the holder to at least one of the one or more chemical containers.

3. The chemical replacement system of claim 1, wherein the transfer module comprises a motor configured to drive the opening of the door unit and the ejection of the holder.

4. The chemical replacement system of claim 1, further comprising:
  a hose configured to deliver a chemical from at least one of the one or more chemical containers to a chemical dispensing system; and
  an automatic winding device configured to wind the hose.

5. The chemical replacement system of claim 1, wherein the holder comprises three placement sensor structures.

6. The chemical replacement system of claim 5, wherein each placement sensor structure can include a sensor pin, a sensor bracket, a spring, and a photo interrupter.

7. The chemical replacement system of claim 1, further comprising an identification (ID) sensing device configured to receive the request signal to replace the chemical container from an automated vehicle configured to hold a replacement chemical container.

8. The chemical replacement system of claim 7, wherein the ID sensing device comprises a radio frequency identification (RFID) reader.

9. The chemical replacement system of claim 7, wherein the automated vehicle comprises:
  a vehicle body configured to hold the replacement chemical container;
  a plurality of wheels configured to move the automated vehicle from one location to another location; and
  a robotic arm configured to load and unload the replacement chemical container.

10. A photoresist (PR) replacement system, comprising:
  an automated vehicle configured to hold and transport a PR bottle;
  a computer system configured to:
    receive a request signal to replace the PR bottle; and
    transmit a command based on the request signal; and
  a transfer module comprising a holder and a transfer unit, wherein the holder comprises a placement sensor structure configured to optically determine a placement of the PR bottle in the holder, and wherein the transfer module is configured to:
    hold the PR bottle in the holder; and
    eject the holder using the transfer unit.

11. The PR replacement system of claim 10, wherein the automated vehicle comprises:
  a vehicle body configured to hold the PR bottle;
  a plurality of wheels configured to transport the PR bottle; and
  a robotic arm configured to load and unload the PR bottle.

12. The PR replacement system of claim 10, wherein the placement sensor structure comprises a photo interrupter.

13. The PR replacement system of claim 10, further comprising an identification (ID) sensing device configured to detect an ID tag on the automated vehicle.

14. The PR replacement system of claim 13, wherein the ID sensing device comprises an radio frequency identification (RFID) reader and the ID tag comprises an RFID tag.

15. A method for replacing a photoresist (PR) bottle using a chemical replacement system, comprising:
  receiving a request signal for replacing the PR bottle in a holder;
  transmitting, via a communication network, a command to a transfer module;
  scanning and detecting objects surrounding a door unit associated with the holder to avoid collision;
  ejecting, with the transfer module, the holder; and
  replacing the PR bottle in the holder with another PR bottle transported by an automated vehicle.

16. The method of claim 15, further comprising winding a hose, with an automatic winding device, wherein the hose is configured to deliver PR from the PR bottle to a chemical dispensing system.

17. The method of claim 15, wherein scanning and detecting the objects surrounding the door unit is performed prior to ejecting the holder.

18. The method of claim 15, wherein the automated vehicle comprises a robotic arm, and wherein replacing the PR bottle in the holder with the another PR bottle in the automated vehicle comprises:
  transferring, with the robotic arm, the PR bottle from the holder to the automated vehicle; and
  transferring, with the robotic arm, the another PR bottle from the automated vehicle to the holder.

19. The method of claim 15, further comprising confirming, with a placement sensor, a placement of the another PR bottle in the holder.

20. The method of claim 19, further comprising sending a notification to an electronic device to report a misplacement of the another PR bottle in the holder.

* * * * *